United States Patent

[11] 3,582,865

[72] Inventors Donald R. Franck
Endicott;
Cortland P. Hill, Vestal, both of, N.Y.
[21] Appl. No. 885,596
[22] Filed Dec. 16, 1969
[45] Patented June 1, 1971
[73] Assignee International Business Machines Corporation
Armonk, N.Y.

[54] MICROCIRCUIT MODULE AND CONNECTOR
13 Claims, 6 Drawing Figs.

[52] U.S. Cl. ........................................................ 339/17,
317/100, 317/101, 339/176
[51] Int. Cl. ........................................................ H01r 13/50,
H05k 1/00
[50] Field of Search ............................................ 317/100,
101; 339/17, 74, 75, 174, 176, 192, 108, 110, 255
P, 21, 22; 174/Inquired

[56] References Cited

UNITED STATES PATENTS

| | | | |
|---|---|---|---|
| 3,311,790 | 3/1967 | Vizzier, Sr., et al. .......... | 339/174X |
| 3,334,325 | 8/1967 | Conrad et al. ................ | 339/14R |
| 3,391,382 | 7/1968 | Leibovitz ...................... | 339/174 |
| 3,475,657 | 10/1969 | Knowles ....................... | 339/176MPX |

*Primary Examiner*—Stephen J. Novosad
*Assistant Examiner*—Terrell P. Lewis
*Attorneys*—Hanifin and Jancin and Harry T. Berriman

ABSTRACT: Integrated circuit devices are mounted on a thin polyimide laminate substrate which is bonded around a heat sink and support member to form a module. Conductive circuit paths carried on both external and internal planes of the laminate substrate link the integrated device circuits to spaced contact areas along edge areas of the substrate. A pressure cap surrounds the module and is flexed with a tool to permit low insertion force engagement of the module with a board structure including a polyimide laminate socket having contact areas aligned for forcible engagement with the module contact areas by action of the pressure cap upon release of the tool. The pressure cap forces maintaining positive electrical engagement are applied parallel to the circuit board.

PATENTED JUN 1 1971 3,582,865

INVENTORS
DONALD R. FRANCK
CORTLAND P. HILL

BY Harry T. Berriman
AGENT

MICROCIRCUIT MODULE AND CONNECTOR

BACKGROUND OF THE INVENTION

This invention relates in general to electronic circuit modules and connectors and more particularly to a miniaturized high-circuit-density module utilizing one or more integrated circuit devices, the invention including a cooperating companion miniaturized low-insertion-force connector structure for electrically and mechanically linking the module to a circuit board.

DESCRIPTION OF THE PRIOR ART

There has been a continuing decrease in size of electronic circuits from the vacuum tube to transistors and now to monolithic circuits of microscopic size. This evolution to smaller and smaller circuits includes a companion decrease in circuit operating times by reason of shortened electronic path transit times, etc. In order to take advantage of the faster operating circuits, packaging and connector systems having electrical characteristics that do not degrade the faster circuits have been under a continual state of development. The packaging and connector art continues to be the weak area in fully utilizing the circuit speeds available in today's monolithic circuits.

Prior art techniques for packaging and connecting miniaturized circuits have included flat pack circuit structures arranged in stacks or tiers with electrical connections being made between the stacks by pins extending therethrough or by edge connectors. The multitiered structures usually terminate in an area array of pin contacts on one side which are plugged into deflectable socket elements on a circuit board. It will be appreciated that with the increasing circuit densities, the resulting large number of connector pins requires an appreciable insertion force in plugging the circuit structure or module into the circuit board.

This type of module-contact structure may be defined as a force-fit sliding, high-contact-pressure connector wherein the mechanical beam (socket) is deflected during insertion and also supplies the contact force. An objection to this type of structure is that the required geometry of the module-circuit board structure that can withstand the required high insertion forces degrades the electrical performance and additionally, the required contact pressures to maintain good electrical contact as you attempt to go to smaller structures are increasingly difficult to obtain. The need for mass in the structure and smallness for maintenance of electrical characteristics work at cross purposes to each other.

Other prior art connector techniques include devices wherein the electrical current and signals are carried by a mechanical beam that does not supply contact pressure until a gear, cam screw or the like is actuated to deflect the beam and create contact pressure. Since the beam-type contact must be of some appreciable size to achieve adequate contact pressures, there is also a limit to which these structures can be reduced in size and accordingly electrically degradation results.

A module package connector system that operates to apply the contact pressures external to the actual contact elements is shown in U.S. Pat. No. 3,391,382. In this patent there is provided an electrical connector body formed of insulation material primarily and which includes spaced locking surfaces. There is also provided a connector cover formed with spaced locking surfaces engageable with locking surfaces of the body to secure the cover and a microelectronic circuit device to the body. Leads are associated with the connector body so that the microelectronic circuit device clamped between the flexed cover and the body has its lead wires pressed against the body connector leads.

The present invention has a number of advantages over U.S. Pat. No. 3,391,382 in that in the latter pressure is applied to the entire structure in applying the connector cover. This requires appreciable rigidity and mass of not only the connector but also to the circuit board with which the connector is associated. Here again mass and rigidity of the required mechanical structure does not permit the close contact-connector spacings required to fully exploit the inherent operating speeds of today's most advanced circuits.

The subject invention module-connector or microcircuit assembly has advantages over the above noted art in that through a pressure cap actuated by a lock-release tool, the contact locking pressures are applied external to the main body of the module. Very close spacing and mass is accordingly possible for the module. Additionally, the pressure locking force is applied in a plane parallel to the associated circuit boards so that the circuit board in turn has to withstand only nominal pressures. As a further advantage, a reference ground plane is arranged in very close proximity to the actual contacting connector areas so that the overall impedance of the device is very low with precisely predictable transmission line characteristics. Consequently, there is little degradation of the circuit speeds inherent with the monolithic circuits of the device. This limited degradation also results from the very compact module structure with minimal distances between the module circuits and the connector areas. The subject invention is thus a unique combination of electrical-mechanical characteristics which permits very high circuit density, small module-connector size and minimal degradation on the circuit speeds of the associated monolithic circuit devices. A unique microcircuit assembly accordingly results.

SUMMARY OF THE INVENTION

In the form of the present invention there is provided a sandwichlike substrate or laminate of alternating layers of conductive material and polyimide insulation. One outer layer of the substrate is a continuous copper ground plate, while the other outer layer is a circuit pattern plane including conductors terminating in lines of closely spaced contact areas along edges of the substrate. Inner conductive circuit layers of the substrate are used for power transmission and signal paths. The substrate has a number of windowlike openings therethrough in which are mounted multicircuit monolithic circuit devices. Each of these devices has wire leads extending from the perimeter thereof which are connected to conducting pad areas of the circuit pattern on the substrate thus electrically connecting the monolithic circuits to the substrate circuit patterns.

The substrate is bonded around a rectangular heat sink of copper, the monolithic device areas of the substrate being on opposed parallel sides of the heat sink with the copper ground plane of the substrate being bonded to the heat sink surface. The edge contact areas of the substrate are along the outer edges of opposed faces of the heat sink. A pressure cap is attached to and surrounds the substrate and is tensioned so that lower edges thereof normally bear against the area of the substrate adjacent the contact areas of the substrate. The sides of the cover have openings thereof to receive fingers of a tool which can be manually operated to flex the lower edges thereof clear of the contact areas of the substrate when the module is to be inserted into a mating socket structure carried by a circuit board.

The socket structure comprises a polyimide laminate structure that has a base area that abuts the circuit board and has upwardly projecting end areas or flanges at opposed sides thereof. On the inner surface of each of these projecting end areas is a line of etched contact areas adopted for engagement with the companion line of contact areas on the module substrate. The socket contact areas are linked by conductive line patterns to an area array of pins on the structure base area and which extend through the circuit board to permit wire wrap or similar connections to be made thereto.

Secured to the circuit board adjacent each of the upwardly projecting contact areas of the socket structure is a spring channel that urges the related contact area inwardly. These channels provide enough tension to cause a wiping action between the socket contact areas and the module contact areas as the module is inserted into the socket structure. After the module is inserted, the insertion tool is released to permit the module pressure cap sides to flex inwardly. As it does, the lower edges thereof engage the flexible channels and force the adjacent contact areas of the socket tightly against the module contact areas to thus electrically connect in effect, the module circuits to the pin area of the circuit board. The laminate polyimide socket structure not only translates the module line connector areas to an area pin array but also on another surface thereof includes a continuous reference ground plane to maintain the desired impedance characteristics of the entire socket structure in the same manner as the ground plane of the module substrate. It will be appreciated that the contact-engaging pressures applied by the pressure cap are parallel to the circuit board so that massive support structures for the board are not required.

A copper channel is carried on the circuit board above the area pin array and includes an upwardly projecting portion for engagement with a mating slot in the heat sink of the module to not only guide the module into position, but to also provide a ground connection to the heat sink and in turn to the module substrate ground plane. The copper channel also carries power bus bars insulated therefrom which engage exposed areas of an inner conductive plane of the module substrate to provide power to the associated monolithic circuit devices.

The result of the above structure is a very small circuit module-connector package which is inserted into the circuit board with limited pressure and with high contact pressure being subsequently supplied parallel to the board by the pressure cap to forcibly maintain the module and circuit board contacts in engaged positions. The structure permits not only very close spacing of the connector-circuit board contact areas but also provides a very close spacing therewith of adjacent ground plane areas to virtually eliminate contact geometry as an electrical effect. The module-connector or microcircuit assembly is thus able to fully exploit the inherent high circuit speeds and densities of today's advanced circuits.

It is accordingly an object of the invention to provide an improved miniaturized circuit module-connector having low insertion force, high-density-connection capabilities and adapted for use with monolithic circuits without degrading the high-speed electrical operation thereof.

Another object of the invention is to provide an electronic circuit module-connector for circuit boards having very low insertion force, high final contact pressure in a direction parallel to the board, and having high density connection ability and virtual elimination of contact geometry as an electrical effect.

It is a further object to provide a high-circuit-density microcircuit module-connector to a circuit board which has high contact pressure, low insertion force and wherein an outside force in the form of a pressure cap that is insulated from the electrical contacts supplies the high contact pressure.

It is a further object to provide an improved module connector as in the immediately preceding object wherein a manual tool operable on the pressure cap holds the contact pressure supplied thereby in nonengaged position during insertion of the module on the circuit board to minimize insertion pressures whereafter the tool is operated to permit the pressure cap to apply its high contact-maintaining pressure.

Still a further object of the invention is to provide an improved high circuit density/high interconnection density module-connector having low insertion force and wherein impedance effects are accurately predictable and minimized by reason of a ground plate structure maintained in close proximity to the circuit and interconnection areas.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
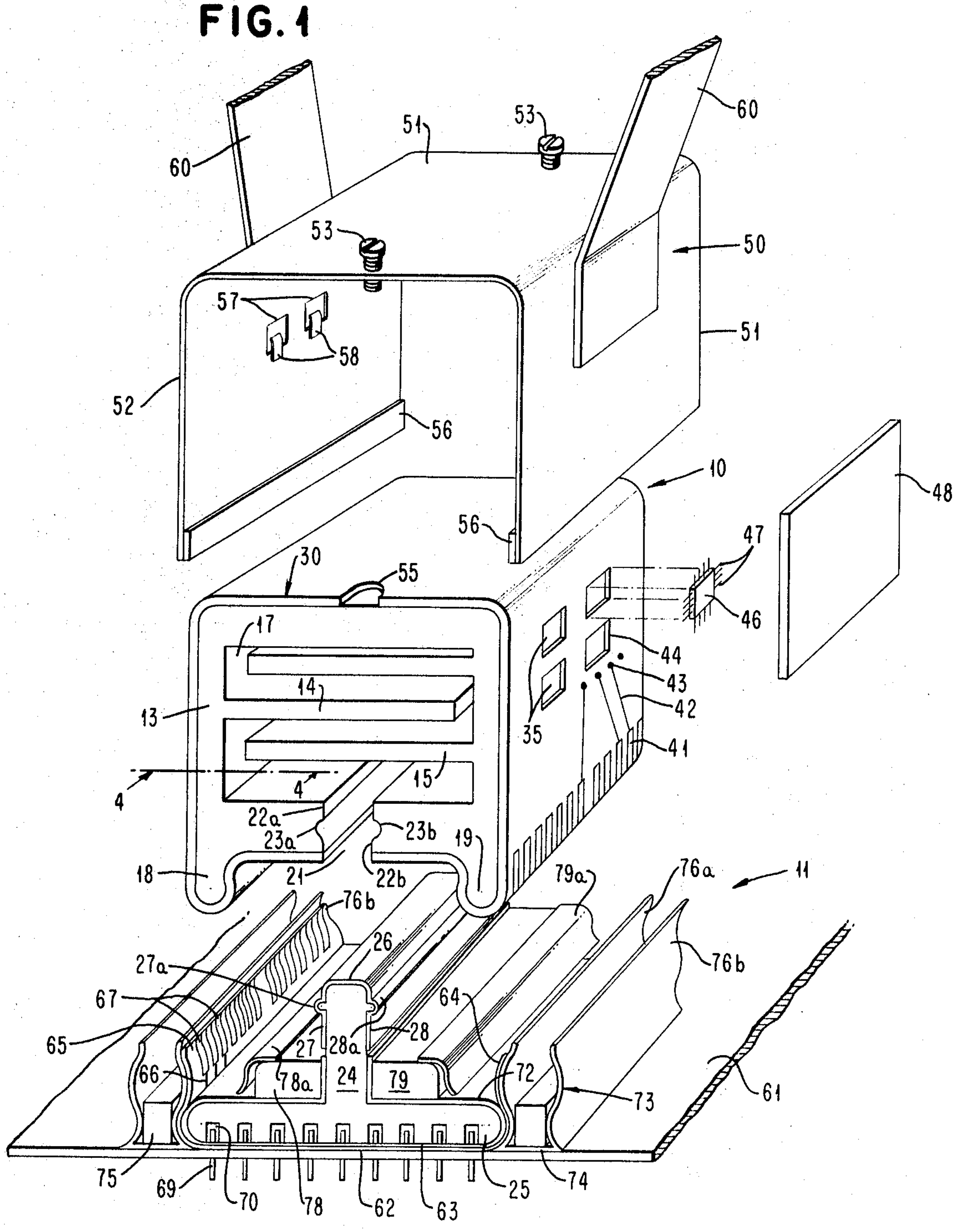
FIG. 1 is an exploded perspective view of the invention and shows the module-connector in its unmated position relative to the associated circuit board.
Figure 2:
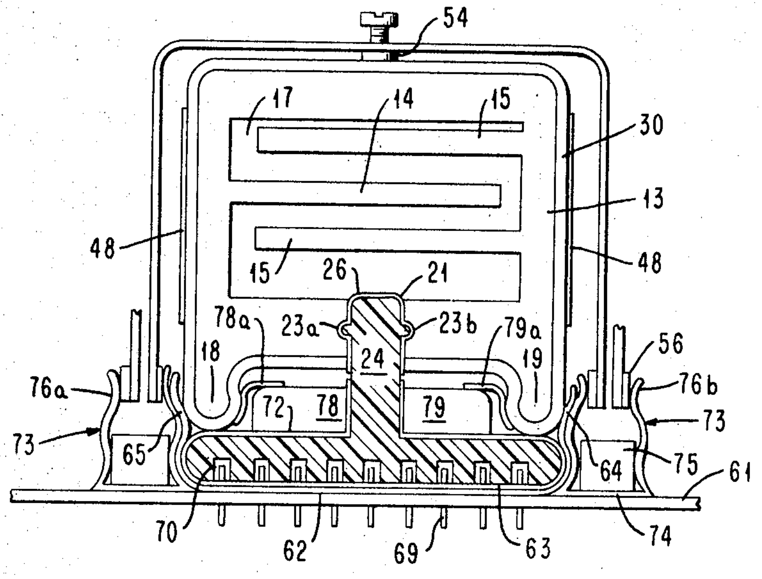
FIG. 2 is an elevation view of the module-connector shown in its mated position relative to the circuit board, with the supply voltage/ground rail mechanism being shown in section to facilitate illustration.

Referring now to FIGS. 1 and 2, the module-connector is comprised of two main elements, a module portion generally designated 10 and a circuit board section generally designated 11 into which the module may be engaged to establish electrical connections between the module and board.

The module 10 is constructed of a central, generally rectangularly shaped copper heat sink member 13 which also serves as the main support member of the module. The heat sink 13 includes cooling fins 14 and 15 which extend from opposed sides thereof into a cavity 17 within the heat sink. During operation of the module, air is forced through the cavity 17 to cool the heat sink. The heat sink includes two penisularlike projections 18 and 19 which extend from each side of the heat sink along the opposed lower edges thereof. These projections extend parallel to each other along the entire lower edges of the heat sink.

A slot 21 is cut in the lower surface of the heat sink at the mid area thereof and extends from the forward to the rearward face of the heat sink. The slot also extends from the lower surface of the heat sink into the cavity area 17 to thus form opposed slot faces 22*a* and *b*. Extending longitudinally in each of the faces 22*a* and *b* is a groove 23*a* and 23*b* respectively. When the module 10 is inserted into the board 11, the slot 21 is engaged by an upwardly projecting rail section or guide member 24 of a ground channel 25 of the circuit board to guide the module into connecting position. The ground rail 24 includes a spring-clip member 26 having flexible sides 27 and 28, each of the latter including a longitudinally extending rib 27*a* and 28*a* respectively adapted to snap into a related one of the grooves 23*a* and 23*b* as shown in FIG. 2 to lock the module in fully engaged position with the board 11.

The module structure 10 also includes a multilayered substrate or laminate generally designated 30 of alternating layers of copper and polyimide insulation. The overall thickness of the substrate is in the range of 0.025.

Figure 3:
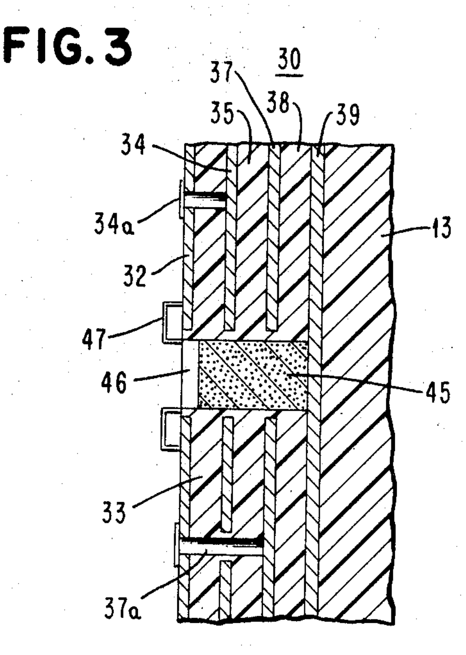
FIG. 3 is an enlarged cross-sectional view through the module-connector multilayered substrate, the view being taken in an area adjacent a monolithic circuit device mounting position and shows the manner in which internal plane signal and power circuits are connected to the monolithic device circuits.

FIG. 3 shows a cross-sectional view through the substrate and indicates that the substrate is multilayered structure formed of an outer conductive signal layer 32 on one surface, an adjacent layer of polyimide 33 or other suitable insulative material, an inner conductive signal layer 34, another layer of polyimide 35, an adjacent conduction layer 37 by which power is made available through the substrate in a manner that will be later evident, another layer of polyimide 38 and finally an outer copper layer 39 which serves as a ground and heat sink for the substrate. The substrate is flexible and is bonded to the heat sink 13 from the one edge of the slot 21 around the outer surface of the heat sink to the other edge of the slot 21, as indicated in FIGS. 1 and 2. The copper heat sink and ground layer 39 is engaged with the surface of the heat sink 13 to form an electrical and thermal bond therewith.

The outerconductive signal layer 32 of the substrate is not a continuous copper layer but actually contains etched circuit patterns some of which terminate in a line of spaced contact areas 41 along the outer lower edge of each side of the module, the contact areas of the right side of the module being shown in FIG. 1, and there being a similar line of contact areas (not visible) on the left side of the module. These contact areas are very closely spaced in the range of 0.025 inch between adjacent contact areas. Some of these contact areas are connected by suitable etched conductive lines such as 42 of the original layer 32 to form electrical paths from the contact areas to spaced conductive terminal areas 43 adjacent the parameter of rectangular windowlike openings 44 cut through the substrate. In the module shown, there are four of these openings 44 in each side of the substrate and they are adapted to receive a related multicircuit monolithic device or substrate 46. Each device 46 has a large number of operational circuits therein which are appropriately linked through internal circuitry to wire leads 47 extending from the perimeter thereof. Upon insertion of a monolithic device 46 into its related opening 44, the associated leads 47 are adapted to overlay the conductive terminal areas 43 to which the leads are bonded, thus electrically connecting the monolithic device circuits to the substrate circuit pattern 30 and making an integral structure.

FIG. 3 illustrates in enlarged form a monolithic device 46 arranged in a window 44 of the substrate 30, the semiconductor substrate 46 being bonded by a suitable conductive dispersion 45 to the ground plane 39. The previously mentioned +3-volt conductive supply plane 37 or layer of the substrate 30 is connected to circuits of the outer layer 32 and in turn to the monolithic device circuits, as desired, by conventional plated hole connections 37*a*, as shown, it being noted that the signal plane 34 through which the plated hole connection extends has its conductive areas recessed from the edges of the plated hole so that it will not electrically short thereto. In a similar manner, a plated hole connection such as 34*a* may be made from circuits on the outer plane 32 to the internal signal plane 34. It will be appreciated that the circuit personality of the internal signal plane 34 and the external circuit plane 32 as well as the points at which through-hole connections are to be made to the internal signal plane 34 and power plane 37 are planned for prior to the lamination of the substrate. It will also be appreciated that each of the four monolithic circuit substrates or devices 46 on each side of the substrate 30 can be linked not only in any desired manner to the circuits on its companion devices 46 on that side of the module through the external and internal signal planes, but can also in the same manner be linked to the monolithic devices 46 on the other side of the module, since the substrate 30 extends across the top of the module to the other side as previously described. It will also be appreciated that although in FIG. 1 representive contact areas 41 of the module are shown linked to the contact areas 43 adjacent a window 44, any desired ones of the contact areas 41 may be linked as desired through plated holes as shown in FIG. 3 to any desired electrical portion of the substrate. Overlying each of the monolithic device areas of each side of the substrate for protection purposes is a cover 48, each cover terminating above the contact areas 41 of the related side of substrate 30.

The module 10 also includes a so-called pressure cap generally designated 50, the cap being an inverted U-shaped member having a top and two downwardly extending spaced side members or sections 51 and 52. The cap 50 fits over the module with its side members overlying the sides of the substrate 30. The cap is secured to the module so that it forms an integral part therewith (see FIG. 2) by screws 53 which extend through the top member 51 of the cap and into the heat sink and support member 13, it being noted that the substrate 30 has screw clearance areas 55 (FIG. 1) along the top so that the screw 53 and its associated spacer 54 (FIG. 2) does not engage the layers of the substrate. The side members 51 and 52 are not parallel but converge slightly towards each other as they approach their lower edges so that with the cap screwed to the module, the lower edge areas of each side member press towards the related contact areas 41 of the module. An elastic strip 56 extending along the lower inner edge of each side member holds the related tensioned side member clear of the adjacent contact areas 41. It will be noted in FIG. 2, that the spacers 54 on screws 53 maintain the cap free of engagement with the adjacent surface of the substrate 30 at all points except along the lower edge thereof as described above.

Each of the side members 51 and 52 of the pressure cap include a pair of spaced openings 57 cut therethrough in mid areas thereof which are adapted to receive lugs 58 of a related arm 60 of a tool by which the module 10 is inserted into or removed from the board 11. In affixing the insertion tool to the pressure cap, the lugs 58 of each arm 60 are positioned into the related side member openings 57 whereafter the tool is then displaced downwardly slightly relative to the cap 51 so that the lugs slide over the lower and inner surface of the related side member to lock the tool to the cap. If the arms 60 of the tool are then manually deflected towards each other, the related engaged lugs deflect the related side member 51 and 52 outwardly to move the associated strips 56 clear of contact with the related line of contact areas 41. With the pressure cap maintained in this released position, the module 10 may be easily engaged with the circuit board 11 as will be later evident.

Referring to FIGS. 1 and 2, the circuit board 11 comprises an epoxy glass board 61 on which is arranged a multilayered polyimide film socket member generally designated 62 that has a base area 63 abutting the circuit board and upwardly projecting end sections or flanges 64 and 65 at opposed sides thereof. On the inner surface of each of these projecting end sections 64 and 65 is a line of etched contact areas 67 having identical spacing with the contact areas 41 on the related side of the module 10 and adapted for engagement therewith to connect the module circuits to the circuit board.

The socket contact areas 67 are linked by conductive line patterns such as 66 to an area array of contact pins 69 which extend from below the circuit board 61, through the board and through openings in the base area 63 of the socket. A desired pin 69 is soldered or bonded to the related line contact pattern 66 to thus provide a continuous electrical circuit from the related contact area 67 to the associated contact pin 69. The lower ends of the contact pins may be wire wrapped or soldered to conductors which extend to desired circuits of the computer or the like that the module-connector forms a part thereof. The socket member 62 includes a continuous ground plane layer on its other outer surface and one or more of the pins 69 may be soldered to the ground plane where it abuts the board 61 to provide a ground connection. Another insulation layer (not shown) is positioned between the ground plane of the socket and the circuit board 61 where they abut so that the ground plane will not short out any conductive circuit patterns that may exist on the top surface of the circuit board 61.

Forming part of the circuit board 11 and arranged above the base area 63 and within the end sections 64 and 65 of the socket member 62 is the previously mentioned ground channel 25. It will be recalled that the ground channel includes an upwardly projecting guide rail 24 which engages slot 21 of the module to guide the module into connecting positions and also provides a ground link for the heat sink and ground member 13. The ground channel 25 includes a clearance opening 70 therein to accommodate the tops of each of the pins 69 of the circuit board to prevent contact therewith. A layer of insulation 72 is provided between the ground channel and the socket member 62 to prevent shorting of the conductive lines 68 therein. The insulation extends around the edges of the channel 25, across the top surface thereof up the guide rail 26 and terminates clear of the adjacent side 27 or 28 of the rail spring chip 26 and ground member 13 (see FIG. 2).

Secured to the circuit board adjacent each of the socket end sections 64 and 65 is a U-shaped spring channel 73. Each channel is secured to the board by screws (not shown) that extend from the under surface of the board, through the board, through a base area 74 of the channel and into a stiffening and supporting metal member 75 that extends longitudinally within the channel as indicated. The channel includes integral side spring members 76a and 76b each of which is curved to intimately engage the outer surface of adjacent end section 64 or 65 of the related socket member 62. Each side member 76a or 76b in FIGS. 1 and 2 urges the related contact area 67 of end section 64 or 65, respectively, inwardly. Although the circuit board 11 is shown with only one socket member for receiving a module, similar socket members are adapted to be positioned to the left and right thereof on the board, with the other side member 76b of the channel engaging its related socket end area of the adjacent socket member. These adjacent socket members are not shown in the figures in order to facilitate illustration.

Supported in the upper surface of the ground channel 25 on each side of the ground rail 24 are power bus bars 78 and 79. These bars are of course insulated from the ground channel by the previously mentioned insulation 72. A springlike conductive contact member 78a and 78b, respectively, is secured to and extends along the upper edge of the related bus bar as indicated. The bus bars are adapted to provide a power link to the conductive power plane 37 of the module substrate in a manner that will be evident.

Figures 4, 6:
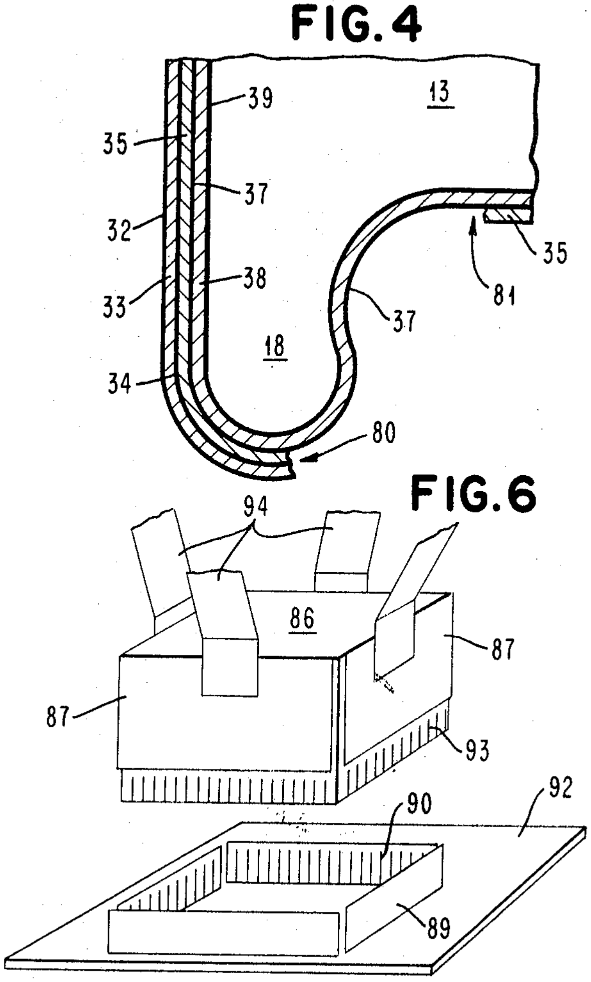
FIG. 4 is an enlarged cross-sectional view of the module connector taken on the plane of the line 4–4 of FIG. 1 and shows the detail construction of the module-connector substrate by which power and ground are linked to the module.
FIG. 6 is a projection view of an alternate four-sided embodiment of the module-connector.

Referring now to FIG. 4, there is shown in greatly enlarged form and not true scale, details of the construction of the substrate 30 in the area 4—4 of FIG. 1, this area extending from the one projection 18 of the heat sink 14 towards the slot 21. It will be recalled from previous discussions of FIG. 3 that the substrate 30 has a sandwichlike construction of layers of insulation and conductors.

Referring now to FIG. 4, the substrate has its outer conductive layer 32, its adjacent insulation layer 33, the inner signal layer 34 and the insulation layer 35 removed to expose the 3-volt power plane 37 from a line generally designated 80 in FIG. 4 extending from a midpoint of each of the projections 18 or 19 (only extension 18 is shown in FIG. 4) around the inner curve of the related projection to a line 81 on the under surface of the heat sink. Between the line 31 and the adjacent side of the slot, the insulative layer 35 is exposed, the other layers 34, 33 and 32 also having been removed.

As the module 10 is inserted into the circuit board in a manner to be explained, the ground rail engages the slot 21 and at the same time, the exposed +3-volt power plane 37 on the inner surface of the related projection 18 and 19, firmly engages and deflects slightly that portion of the associated spring conductive contact member 78a or 79a (see FIG. 2) that slightly overhangs the end of the respective power bar 78 or 79 to thus make firm electrical contact between the plane 37 of the module and the +3-volt bus bars. One end of each of the bus bars 78 and 79 is connected to a +3-volt power supply so that with the module and board engaged, a +3-volts circuit extends from the power supply, through the bus bar 78 and 79, the associated spring contacts 78a or 79a to the module plane 37 to the appropriate points of the circuits on the substrate 30.

Referring again to FIG. 1, the module 10 is inserted into the circuit board 11 as follows. It will be recalled that with the lugs 58 of the arms 60 of the insertion tool in engaged position with the pressure cap openings 57, the arms 60 are deflected towards each other to deflect the side members 51 and 52 of the cap outwardly from the heat sink 13 and substrate 30. With the insertion tool maintained in this position, the module is aligned with the board and the ground channel 24 engaged with the slot 21 of the module. A continued downward movement of the module causes the contacts areas 41 of each side of the module to engage the related contact areas 67 of the socket member 62 and deflect the related end sections 64 or 65 outwardly slightly as they wipe into electrical contact therewith. The end sections 64 or 65 are deflected against the urging of the associated channel spring 73. As the module approaches its fully engaged position, the exposed plane 37 (FIG. 4) of the substrate engages and deflects the associated bus bar contact members 78a and 79a as previously mentioned, the module being in its fully engaged position when the integral rib 27a, 28b on the ground rail spring clip 27 snap into the grooves 23a and 23b of the module (see FIG. 2). With the module in its fully engaged position, and with the insertion tool still in its insertion position described above, the elastic members 56 of each of the side members of the pressure cap are positioned adjacent the related spring channel but free of engagement with the adjacent side member 76a or 76b thereof. The arms 60 of the insertion tool are then permitted to move away from each other, by the urging of the deflected side members 51 and 52 of the pressure cap and correspondingly the lower edges of the side members deflect inwardly to initially engage the elastic strips 56 with the adjacent side member 76a(or *b*) and finally deflect the side member 76a (or *b*) and adjacent end section 64 or 65 of the socket 62 so as to forcibly maintain the contact areas 67 thereon in engagement with the related contact areas 41 of the module. With the module 10 thus in full engagement with the circuit board 11, electrical contact has been established from the circuits of the substrate 30 and its associated monolithic devices 46 to the circuit board pins 69 and circuits linked thereto. Additionally power has been applied from the bus bars 78 and 79 to the module circuits through the power plane 37 of the substrate and additionally ground has been established between the ground channel and the heat sink 13 and the integral ground plane 39 of the module substrate. Ground has also been applied to the ground plane of the socket structure 62.

It will be appreciated that during the insertion of the module 10 into the circuit board 11, only small insertion forces are required since the wiping action of module contact areas 41 and socket contact areas 67 is limited. Thus the deflecting forces not only on the board 11 but also on the module 10 are minimized. Once the module and board are fully engaged, the release of the pressure cap applies the heavy contact-engaging forces to ensure good electrical contact, it being noted that this force is applied parallel to the circuit board and not against the board. With the module fully inserted, the insertion tool is removed from the pressure cap by moving the tool upwardly slightly to free the lugs 58 from the cap openings 57.

When it is required to remove the module 10 from the circuit board 11, the arms 60 of the insertion tool are again engaged with the pressure cap and actuated to remove the pressure cap from the end sections 64 and 65 of the circuit board socket 62. With the contact pressure thus released, the module is easily removed by moving the insertion tool upwardly while maintaining the cap side flexed outwardly free of the related channel 73.

While only one module is shown in FIGS. 1 and 2 the circuit board is actually arranged to accommodate a plurality of the modules in side to side, and front to back positions. Thus in FIG. 5 there is shown a simplified top plan view of a circuit board wherein there is an array of 12 modules in a 3-deep × 4-row-wide arrangement. It will be noted in FIG. 5 that the modules abut each other in their front-to-back relationship with the front of the first module of each row abutting a guide block 82 carried by the circuit board 61 and the back surface of the rear module of each row abutting a similar split guide block 83. The ground channel 25 with its ground rail 24 and power bus bars 78 and 79 for each row of modules is a continuous structure extending under all three modules of a row and beyond the rearmost module to the edge of the circuit board as indicated. The rear row guide block 83 is accordingly split in sections as shown to permit the ground channel 25 of each row to extend to the edge of the circuit board as indicated. Suitable electrical connections can be made to the ground channel 25 and associated power bus bars 78 and 79 to thus power each row of modules.

Figure 5:
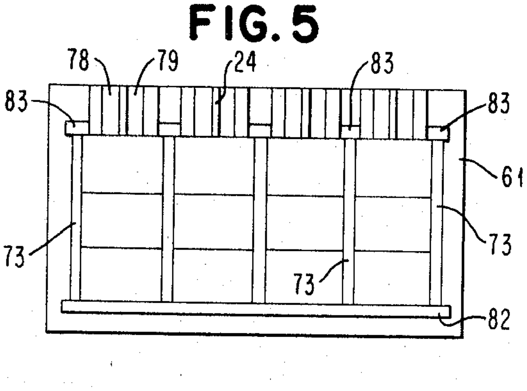
FIG. 5 is a top plane view showing a 4×3 array of the module-connectors in position on a circuit board.

It will also be noted in FIG. 5 that each row of three modules is spaced from its adjacent row by reason of the channel springs 73 being wide enough to permit the module insertion tool to be freely applied to any desired module.

Referring now to FIG. 6 there is shown in simplified form an alternative embodiment of the improved module-connector which differs from the embodiment shown in FIGS. 1 through 5 in that its module pressure cap 86 has four deflectable walls 87, one on each side, rather than the two-sided structure previously described. Thus as also shown in FIG. 6, the mating circuit board socket structure 89 is in the form of a four-sided open rectangular form having split corners and with contact areas 90 being arranged in groups around each of the four inner sides of the socket structure 89. The socket structure is carried on a circuit board 92. Similarly, the module has matching groups of contact areas 93 on each of the four sides of the module. A four-sided rectangular channel structure (not shown) surrounds and abuts the four sides of the socket structure in a manner similar to the action of the previously described channel springs 73. An insertion tool 94 provided for the four-sided module in FIG. 6 deflects all four sides outwardly to facilitate low insertion force engagement of the module with socket. Thereafter release of the tool permits the lower ends of the four sides of the pressure cap to deflect inwardly, each side engaging the adjacent spring channel and forcing the adjacent socket structure contact area against the companion module contact area to connect the module to the circuit board. Since the module has four sides, the ground rail and channel (not shown) cannot extend beyond the module as in the version shown in FIGS. 1 through 5, but is confined within the socket assembly with connections and power being made thereto through pins on the circuit board.

The four-sided module connector of FIG. 6 has the same low insertion force, high circuit density, high connector capacity of the two-sided module, with the actual locking contact force being applied by the pressure cap in a plane parallel to the related circuit board 92. It will also be appreciated that since in the four-sided module the module substrate (corresponding to the substrate 30 of the two-sided module) has four sides, it has expanded monolithic circuit device carrying capacity and the circuit density may be higher to fully exploit the expanded four-sided connector capability of the module-connector.

While the invention has been particularly shown and described with reference to preferred embodiments thereof it will be understood by those skilled in the art that various changes in form and detail may be made therein without departing from the spirit and scope of the invention.

What I claim is:

1. A microcircuit assembly for establishing connections of external circuits to circuits of a circuit board comprising, in combination, a microcircuit module the circuits of which are linked to a plurality of exposed connector areas about the periphery of said module, a socket member secured to said circuit board and including flexible flanges projecting therefrom, said module setting within said flanges when engaged with said socket, said flanges having connector areas on the inner surfaces spaced for alignment with said module connector areas when the module is engaged with the socket, pressure means carried by said module and normally forcibly engaged with said module connector areas, means for disengaging said pressure means to permit said module to be freely inserted into said socket said pressure means overlying the outer surfaces of said flanges, and means for releasing said pressure means after said module is inserted into the socket member, said pressure means forcing said flanges into engagement with said module periphery to maintain positive electrical contact between said module and flange connector areas to electrically connect the module circuits with the circuit board.

2. An assembly according to claim 1 characterized in that said microcircuit module comprises a support and heat sink body member and a multilayered circuit laminate including monolithic circuit devices bonded to the outer surface of said body.

3. An assembly according to claim 2 characterized in that said socket member comprises a multilayered circuit laminate having a base area engaging and overlaying a pin array of said circuit board, said flanges being integral with said base area, electrical circuit patterns on said socket interconnecting said flange connector areas to said circuit board pin array.

4. A connector according to claim 2 characterized in that said multilayered circuit laminate covers only part of the surface of the heat sink, said uncovered areas having communicating passages through the heat sink to permit a cooling medium to pass therethrough.

5. An assembly according to claim 2 characterized by a projecting guide member carried by said socket member, said guide member engaging a guide opening in said heat sink to guide said module into mating position with said socket, said guide member being electrically conductive and providing ground potential to said heat sink when the module is engaged with the socket.

6. An assembly according to claim 2 characterized in that said module multilayered circuit laminate has an exposed power plane on an area thereof, said plane having connections through said laminate to desired circuits thereof, said socket member carrying power members which engage said exposed plane when said module is engaged with said socket to thus provide power to said module.

7. A microcircuit assembly comprising, in combination, a rectangular heat sink and body member having a central cavity therein which communicates with the outside surface of two opposed faces of said heat sink so that a cooling medium can pass through said cavity, said body including cooling fins that extend from the main portion of said body into said central cavity, a multilayered circuit laminate having external and internal circuit pattern planes and an external ground plane, said external and said internal circuit patterns being connected at desired points by connections through required layers of said laminate, said laminate being bonded to said heat sink body with the ground plane abutting the heat sink, said laminate including lines of connector areas arranged on opposed sides of said heat sink and body member, said laminate circuit patterns being connected as required to said lines of connector areas to permit external connections to be made thereto, a plurality of monolithic circuit devices supported within window areas cut in said laminate, and including circuit leads which are bonded to said laminate circuit patterns, each circuit device being thermally bonded to said heat sink and body member, pressure cap means secured to said body member and including tensioned sections normally urged toward engagement with said connector areas, a circuit board including an area array of connection pins supported thereby, a laminate socket member having a base member and two flexible end flanges projecting therefrom, said flanges having connector areas on inner surfaces and adapted for engagement with said body member circuit laminate connector areas, said socket base member being secured to said circuit board and overlying said pins and including circuit patterns linking said socket connector areas to said area pins, said socket member including a continuous ground plane on an outer surface thereof and spaced from said flange connector areas and base circuit patterns by an intervening insulating layer, flexible spring members secured to said circuit board adjacent each of said flanges and including a flexible planar section that abuts each of said flanges, means for deflecting said pressure cap tensioned sections clear of contact with said body connector areas to permit said body member to be inserted within said socket member with said flange connector areas overlying said connector areas of said body laminate, and means for releasing said tensioned sections after said body is engaged with said socket, said tensioned means engaging an outer surface of said flexible spring members and flexing said members and the adjacent socket flanges so as to forcibly maintain said flange connector areas and said body laminate connector areas in positive electrical engagement.

8. A microcircuit assembly according to claim 7 characterized further by a ground channel member secured to said socket member and disposed between the flanges thereof, an extension of said ground channel engaging a slot in the undersurface of said heat sink as it is inserted into the socket to not only guide the heat sink into mating position but to apply ground to said heat sink, said ground channel also carrying power bus bars thereon but insulated therefrom which include deflectable spring members which electrically engage an exposed power plane of said body circuit laminate to supply power from said board to said monolithic circuits.

9. A microcircuit assembly comprising, in combination, a body member of heat-conductive material, a multilayered circuit laminate bonded to said body, said laminate including external and internal circuit planes and carrying microelectronic circuit devices thereon having connections to said circuit planes, said external plane including lines of spaced connector areas at predetermined sections thereof, pressure cap means secured to said body and including tensioned sections normally urged toward engagement with said connector areas, a circuit board having an area array of connection pins extending therethrough, a socket structure having spaced lines of connector areas adapted for engagement with said body connector areas, said socket being secured to said circuit board and overlying said area pins and including circuit patterns thereon linking said socket connector areas to said area pins, means for deflecting said pressure cap tensioned sections free of contact with said body connector areas to permit said body to be inserted into said socket with the connector areas of the body and socket being engaged, and means for releasing said tensioned sections after insertion, said tensioned sections engaging said socket member adjacent said socket connector areas to forcibly maintain said socket connector areas electrically engaged with said body connector areas.

10. An assembly according to claim 9 characterized in that said socket connector areas are carried on sections of said socket which project upwardly from said circuit board and with said tensioned sections of said pressure cap applying the connector area engaging force in a plane parallel to the circuit board.

11. An assembly according to claim 10 further characterized in that said body circuit laminate includes a ground plane bonded to said body member to provide an electrical and heat path to said body member, said socket structure also being formed of a laminate with said associated socket connector areas and circuits linked thereto being arranged on the one surface of said laminate, while a continuous ground plane is arranged on the other surface of said socket laminate.

12. A microcircuit module-connector for connecting microcircuits to a circuit board comprising a support and heat sink body, a multilayered circuit laminate bonded to external surfaces of said body, said laminate including integral microcircuit elements having electrical connections to exposed lines of connector areas on an outer surface of said laminate, pressure cap means secured to said body and including tensioned members normally urged towards engagement with said connector areas, a socket member secured to said circuit board and including flexible sections carrying lines of connector areas adapted for engagement with said laminate connector areas to establish electrical connection between said laminate and said circuit board, means for deflecting said pressure cap tensioned means free of contact with said laminate connector areas to permit said body to be inserted into said socket with the connector areas of the body and socket being engaged, and means for releasing said tensioned sections after insertion, said tensioned sections engaging said flexible socket sections to forcibly maintain said socket contact areas engaged with said laminate contact areas.

13. A microcircuit assembly for establishing connections of external circuits to circuits of a circuit board comprising, in combination, a microcircuit module, the circuits of which are linked to line of exposed connector areas along sidewalls of said module, a socket member secured to said circuit board and having electrical connection to said circuit board, said socket member including flexible flanges extending upwardly from said board, said flanges between adapted to accommodate the circuit module therein, said flanges including lines of connector areas on their inner sides and aligned with said module connector areas when said module is engaged with said socket, pressure members carried by said module and normally urged towards engagement with said module contact areas, means for releasing said pressure members clear of said module connector areas wherein said module may be freely inserted into said socket with said pressure members applying the outer surface of said flanges, and means for applying said pressure member wherein they engage the outer surface of said flanges and forcibly maintain the connector areas therein in engagement with the connector areas of the module to establish connection of said module circuit to said circuit board.